United States Patent [19]

Moraghan et al.

[11] Patent Number: 5,784,245
[45] Date of Patent: Jul. 21, 1998

[54] SOLENOID DRIVER AND METHOD FOR DETERMINING SOLENOID OPERATIONAL STATUS

[75] Inventors: Paul Moraghan, Chicago; Roy E. Hunninghaus, Des Plaines, both of Ill.

[73] Assignee: Motorola Inc., Schaumburg, Ill.

[21] Appl. No.: 757,185

[22] Filed: Nov. 27, 1996

[51] Int. Cl.⁶ .................................................. H01H 47/32
[52] U.S. Cl. .................................................. 361/154; 361/152
[58] Field of Search ............................. 361/152–156

[56] References Cited

U.S. PATENT DOCUMENTS

| | | |
|---|---|---|
| 4,631,628 | 12/1986 | Kissel . |
| 4,939,928 | 7/1990 | Carle et al. . |
| 4,970,622 | 11/1990 | Buchl .................... 361/154 |
| 5,053,911 | 10/1991 | Kopec et al. . |
| 5,196,983 | 3/1993 | Stumpf .................... 361/154 |
| 5,293,551 | 3/1994 | Perkins et al. .......... 361/154 |
| 5,347,419 | 9/1994 | Caron et al. . |
| 5,539,608 | 7/1996 | Hurley et al. ........... 361/154 |

FOREIGN PATENT DOCUMENTS

| | | |
|---|---|---|
| 0 225 444 | 6/1987 | European Pat. Off. . |
| WO 90/14716 | 11/1990 | WIPO . |

*Primary Examiner*—Franz Fleming
*Attorney, Agent, or Firm*—Jasper W. Dockrey

[57] ABSTRACT

A solenoid driver (10) capable of detecting the operational status of a solenoid (12) including the position of an armature within a solenoid coil and an operational method. The solenoid driver (10) generates a first solenoid current within the solenoid (12) and measures a first decay time $t_1$. The first solenoid current is insufficient to pull the armature into the coil of the solenoid (12). A comparator circuit (22) continuously monitors the solenoid current and initiates a timer within a counter circuit (34) to compute the first current decay time. A second solenoid current is generated within the solenoid (12) that is sufficient to pull the armature into the coil of the solenoid (12). The second solenoid current is turned off and a second decay time $t_2$ is measured. The decay times are stored in storage registers (R1, R2) within a controller (36). The controller (36) compares the measured decay times with stored values and outputs the armature position information over a communications bus (34).

22 Claims, 8 Drawing Sheets

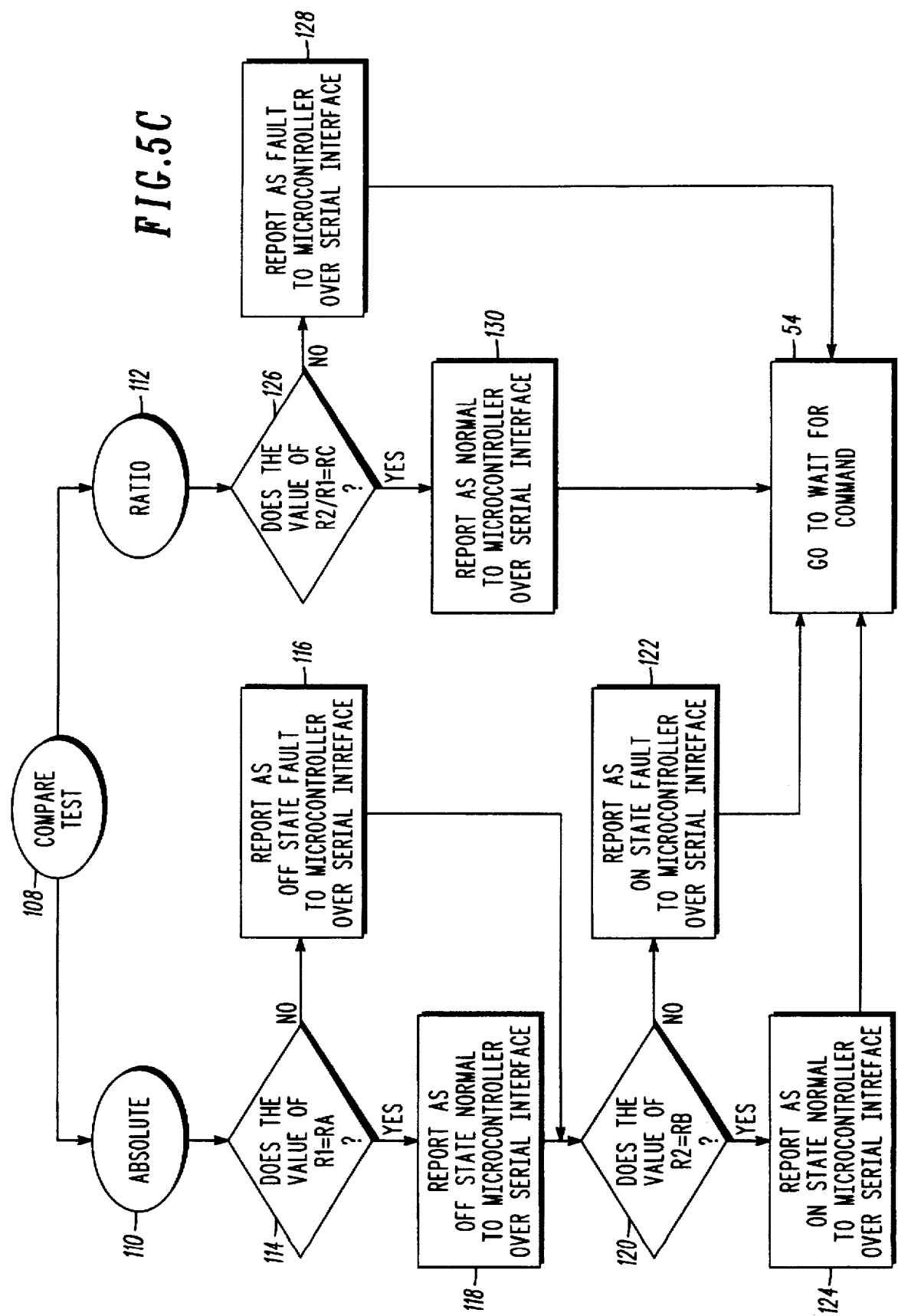

SOLENOID DRIVER AND METHOD FOR DETERMINING SOLENOID OPERATIONAL STATUS

FIELD OF THE INVENTION

This invention relates in general to a solenoid driver circuit controlling the opening and closing of a solenoid, and more particularly, to solenoid drivers containing advanced circuitry and programming logic for determining operational aspects of the solenoid.

BACKGROUND OF THE INVENTION

Solenoids have many applications in a wide range of machinery including automobiles. Solenoids are frequently used in automotive fuel injection systems, electronic transmissions, automatic breaking systems, and the like. Solenoids commonly include an armature surrounded by a coil, such that when the coil is energized the armature is drawn into the coil. All such solenoids use a solenoid driver for energizing the solenoid's coil and controlling the position of the armature.

In advanced automotive systems, electronic control systems within the automobile benefit from information concerning the exact position of the armature within the solenoid. Solenoid drivers of the prior art are effective for energizing the coil and causing the armature to move within the solenoid. However, the determination of the position of the armature within the coil requires advanced solenoid drivers. One such advanced solenoid driver is disclosed in U.S. Pat. No. 5,053,911 to J. W. Kopec, et al., and assigned to the assignee of record herein. The solenoid driver disclosed therein determines when the solenoid has closed by indirectly measuring the inductance within the solenoid coil. The changing inductance of the solenoid's coil is sensed indirectly by measuring current or voltage through the coil. As the armature is drawn into the coil the inductance increases and the current through the coil can be monitored to determine the change in the inductance. In one method, a current pulse is sent through the coil and the decay time of the current pulse is determined to indirectly measure the inductance of the coil. A sensed increase in the decay time indicates an increase in the coil inductance which is an indication that the solenoid is closing.

While the prior art methods are effective to determine whether or not the solenoid has closed, the closure can only be determined when solenoid current is being ramped up. Accordingly, information is only available during a "power on" operational state.

As more stringent pollution control requirements are placed on the automotive industry, more extensive monitoring and feedback systems are needed to meet governmental pollution control regulations. For example, on-board-diagnostics governmental regulations (OBD-II) require monitoring of electronic automatic transmission solenoids. The control electronics must be capable of verifying both movement of the armature and circuit continuity. To meet these requirements, advanced solenoid drivers are necessary to provide more extensive information to system microcontrollers within an automobile. For example, real time feedback of information concerning the open or closed position of solenoids and electrical continuity can be used to adjust engine operation to minimize pollution from engine exhaust. Accordingly, further development of solenoid driver monitoring processes and circuit design is necessary to achieve enhanced monitoring of solenoid operational status.

BRIEF DESCRIPTION OF THE DRAWINGS

FIGS. 5A, 5B, and 5C are flow charts illustrating programming used by the solenoid driver to determine armature status.

DETAILED DESCRIPTION OF PREFERRED EMBODIMENTS

The present invention is for a solenoid driver and method of operation for detecting the operational status of the solenoid and the position of an armature within the solenoid coil. The solenoid driver determines the position of the armature and verifies circuit continuity by generating two current pulses through the solenoid coil. The first current pulse is below the "pull-in" current of the armature. As used herein, the pull-in current is the current level necessary to pull the armature into the coil. The current level of the first current pulse is insufficient to pull the armature within the coil. The second current pulse is created by briefly terminating the electrical current to the solenoid coil and measuring the decay time of the current at a level above the drop-out current. The second current pulse is initiated at a current level that is sufficient to maintain the armature within the solenoid coil.

The two decay times calculated by circuitry within the solenoid driver are compared to reference values stored in memory. In addition, the ratio of the decay times can be computed and compared to a value stored in memory. By comparing the measured values with the stored values, the open or closed status of the solenoid can be determined. Additionally, faults within the solenoid can be detected by comparing the measured decay times and the decay time ratio with values stored in memory that are indicative of proper solenoid operation. The selenoid driver of the invention is capable of detecting the position of the armature while the solenoid is in both an energized and a de-energized condition. In addition, the present invention is insensitive to fluxuations in battery voltage, and noise in battery supply and ground lines.

Figure 1:
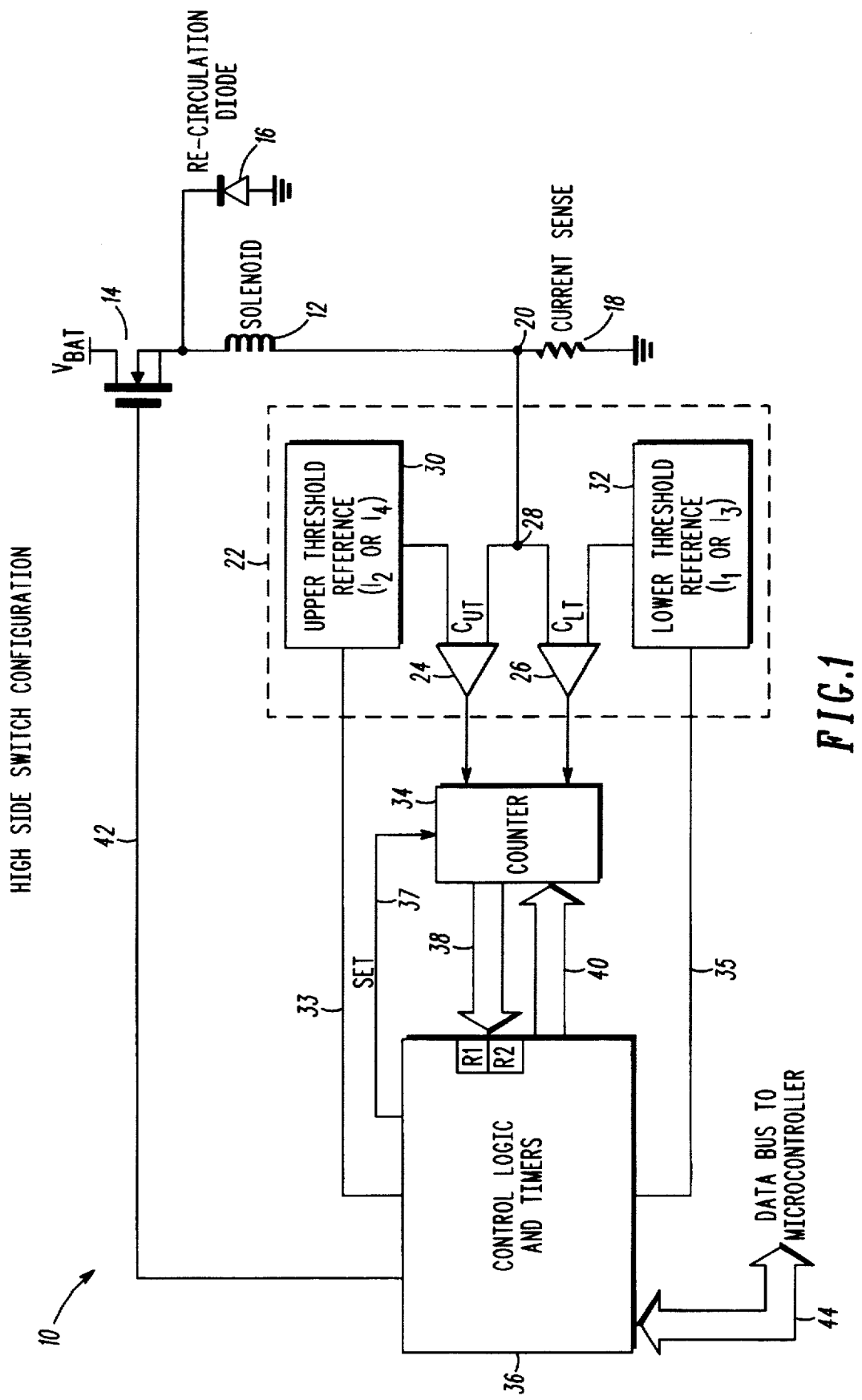
FIG. 1 is a schematic circuit diagram of a solenoid driver arranged in accordance with one embodiment of the invention.

FIG. 1 illustrates a schematic diagram of a solenoid driver 10 arranged in accordance with one embodiment of the invention. A typical solenoid 12 is coupled to a transistor switch 14, and a recirculating diode 16. The other end of solenoid 12 is coupled to a current sensor 18. Current sensor 18 can be a resistor connected to ground, as shown, or a more advanced component such as a magnetic transformer, and the like. Transistor switch 14 can be closed to couple solenoid 12 to a source of DC voltage, designated $V_{Bat}$ in FIG. 1. In the case of a metal-oxide-semiconductor field effect transistor (MOSFET), the source of transistor switch 14 is coupled to ground through current sensor 18. Thus, when transistor switch 14 is turned on, a completed circuit path is established through the coil of solenoid 12 for closing the solenoid. Those skilled in the art will recognize that other types of devices can be used to switch current to solenoid 12.

for example a bi-polar transitor, a magnetic switch circuit, and the like, can also be used.

In the embodiment illustrated in FIG. 1, the current through solenoid 12 is sensed as a voltage developed by current sensor 18 at node 20. The voltage developed at node 20 is coupled to a comparator circuit 22. Those skilled in the art will recognize that a current level can also be sensed at node 20 by including a current ratioing circuit (not shown).

Comparator circuit 22 includes a first comparator 24 and a second comparator 26. First and second comparators 24 and 26 share a common input coupled to node 20 of current sensor 18 through a common node 28. First comparator 24 has a second input coupled to a first reference circuit 30. Second comparator 26 has a second input coupled to a second reference circuit 32. Comparator circuit 22 outputs logic state signals to a counter circuit 34. Counter circuit 34 outputs time signals to a controller 36 over a timing bus 38 and receives control signals from controller 36 over a control bus 40. Controller 36 outputs "power-on" and "power-off" commands over control line 42 to switch 14. Controller 36 also outputs reference voltage commands on lines 33 and 35 reference values to first and second reference circuits 30 and 32, and outputs an initialization set command on line 37 to counter circuit 34. Controller 36 receives command instructions and outputs armature status information over a communications bus 44.

Those skilled in the art will appreciate that reference circuits 30 and 32 can be either voltage references or current references. In a preferred embodiment, the reference values output from first and second reference circuits 30 and 32 can be specified by a command from controller 36. In the case of voltage references, voltage dividers circuits can be employed that are individually selectable by controller 36.

Figure 2A:
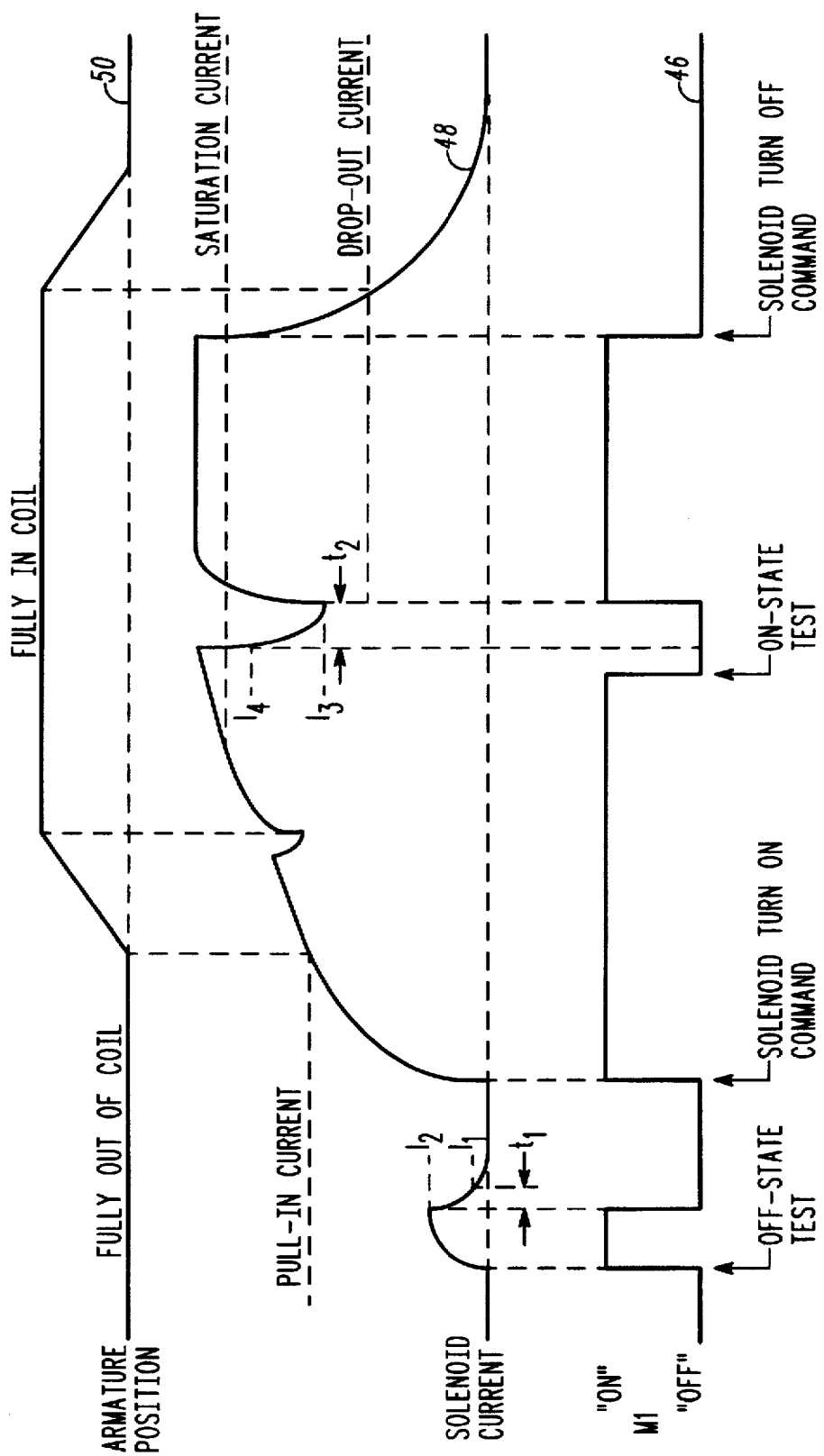
FIG. 2A is a plot of wave forms depicting the operation of the solenoid driver illustrated in FIG. 1.

The operation of solenoid driver 10 will now be illustrated through reference to wave form signals shown in FIG. 2A. Controller 36 is responsive to command signals received over communications bus 44 from an external microcontroller (not shown). In response to a command from the microcontroller to determine armature status, controller 36 initiates a test sequence to determine the armature status. At a time when the armature is fully out of the solenoid core, an off-state test is initiated as shown by switch status 46 in FIG. 2A. At the time an off-state test is initiated, a current pulse is generated through solenoid 12, as indicated by solenoid current level 48. Transistor switch 14 is closed and the solenoid current is permitted to build to a level $I_2$. Current level information is fed back to controller 36 through first comparator 24 of comparator circuit 22. Once current level $I_2$ is obtained, controller 36 opens transistor switch 14 and the solenoid current begins to decay, as illustrated by solenoid current level 48. When the solenoid current decays to a reference current $I_1$, as determined by second comparator 26, a decay time $t_1$ is determined by counter circuit 34 and relayed to controller 36 for storage in a storage register R1 within controller 36.

It is important to note that decay time $t_1$ is measured while the armature is fully out of the coil, as indicated by armature status 50. Solenoid drivers of the prior art lack the ability to detect the condition of a solenoid in the de-energized state. This step is important in providing useful information to system microcontrollers used in automotive systems, such as electronic transmission, and the like.

Once decay time $t_1$ is determined, the solenoid current is increased to a level above the pull-in current. At this current level, solenoid 12 is energized and the armature is pulled into the solenoid coil, as indicated by armature status 50.

Once the armature is fully within the coil, an on-state test is initiated by controller 36. As shown by switch state 46 in FIG. 2A, transistor switch 14 is opened and the solenoid current begins to decay. Counter circuit begins counting when the solenoid current has reached an upper reference level $I_4$ as determined by first comparator 24. The solenoid current is allowed to decay to a lower reference level $I_3$ as determined by second comparator 26. Counter circuit 34 then outputs a second decay time $t_2$ to controller 36 over timer bus 38 for storage in storage register R2 within controller 36. It is important to note that lower current reference $I_3$ is above the drop-out current of the armature within solenoid 12. Accordingly, the second decay time $t_2$ is determined while the armature is maintained within the solenoid coil as shown by the armature position indicator in FIG. 2A.

Figure 2B:
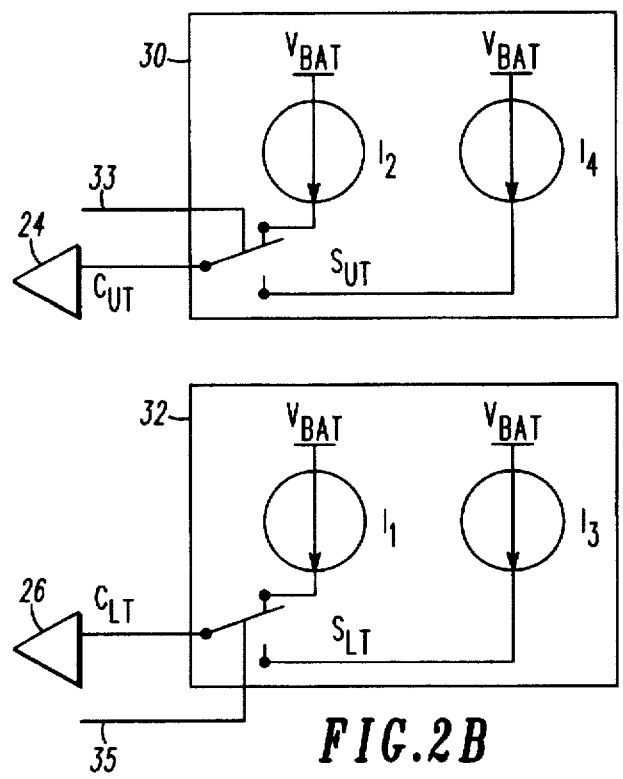
FIG. 2B is a schematic diagram of current source circuitry within comparitor circuit 22 shown in FIG. 1.

The measurement of decay times t1 and t2 depends upon the generation of upper and lower control points to start and stop the counting cycle. As shown in FIG. 2B, within first reference circuit 30 there are two current sources, $I_2$ and $I_4$ that serve as references for the upper control points. Similarly, current sources $I_1$ and $I_3$ serve as references for the lower control points. The current sources are connected to a battery power supply $V_{BAT}$. Signals 33 and 35 are generated by controller 36 and control the position of switches $S_{UT}$ and $S_{LT}$ in reference circuits 30 and 32, respectively. When activated, the switch $S_{UT}$ connects one of the two current sources within to reference circuit 30 to first comparitor 24. Similarly, switch $S_{LT}$ connects one of the two current sources within reference circuit 32 to second comparitor 26. Operational logic for the switching sequence is depicted in the following truth table.

| Test | line 33 | Current | line 35 | Current |
|------|---------|---------|---------|---------|
| Off  | 0       | $I_2$   | 0       | $I_1$   |
| On   | 1       | $I_4$   | 1       | $I_3$   |

As previously described, once first and second decay times $t_1$ and $t_2$ have been determined, these values are output by counter circuit 34 to controller 36. Controller 36 then compares the normal decay time for a properly functioning solenoid with the actual decay time determined by solenoid driver 10.

Figure 3:
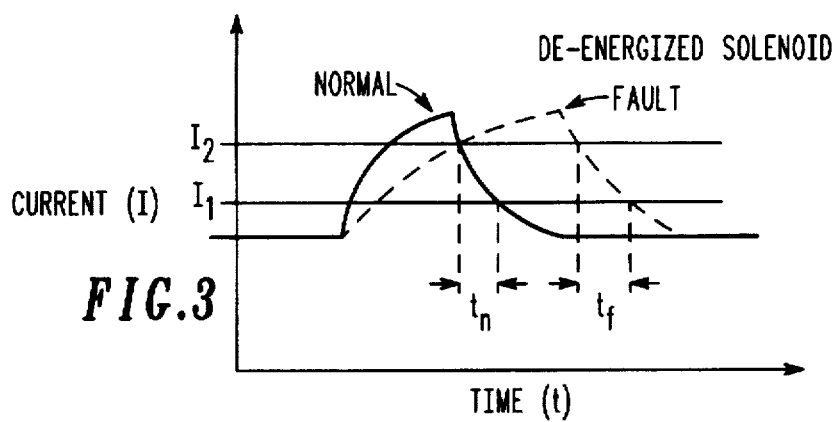
FIGS. 3 and 4 are plots of current versus time for a de-energized solenoid and an energized solenoid, respectively.
Figure 4:
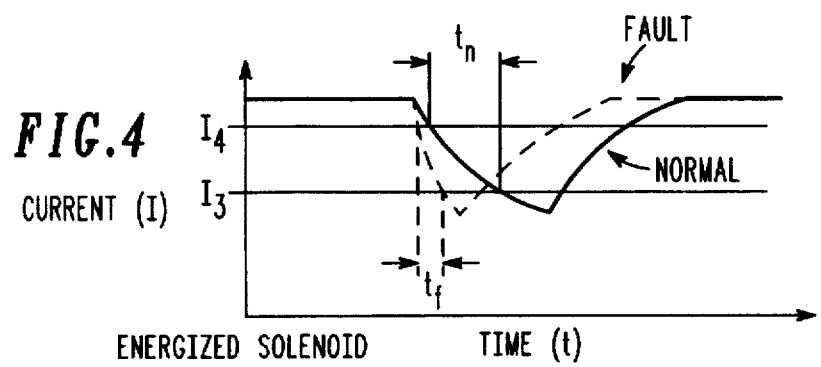

FIGS. 3 and 4 show a graphical comparison of normal solenoid current patterns with a decay current patterns from a faulty solenoid. Specifically, FIG. 3 illustrates a plot of current versus time for both a normal solenoid and for an improperly functioning solenoid exhibiting a fault. As shown, the decay time between current levels $I_2$ and $I_1$ for a normal condition result in a decay time $t_n$ while a decay time for a faulty solenoid between current levels $I_2$ and $I_1$ is $t_f$.

FIG. 4 is a plot of solenoid current versus time for an energized solenoid in which the current level is above that necessary to maintain the armature within the solenoid coil. As shown in FIG. 2, the solenoid current decay is initiated by briefly opening transistor switch 12 at a time when the armature is fully within the solenoid coil. The on-state current decay patterns for a normal and faulty solenoid are indicated, where the decay time between current levels $I_4$ and $I_3$ for a normally functioning solenoid is $t_n$, and a faulty solenoid $t_f$.

By comparing current patterns shown in FIGS. 3 and 4, it is apparent that the decay time for a faulty solenoid in a de-energized condition is greater than that for a normally functioning solenoid. In the energized condition, the decay time for a faulty solenoid is substantially less than that of a normally functioning solenoid. Controller 36 compares the measured decay times with stored values for normally functioning solenoids as indicated in FIGS. 3 and 4 to determine the operational condition of solenoid 12. In addition to the comparison with absolute values for normal decay times, the measured decay times can also be ratioed and compared with ratios of normal decay times to provide further information concerning the operational status of solenoid 12.

Figure 5A:
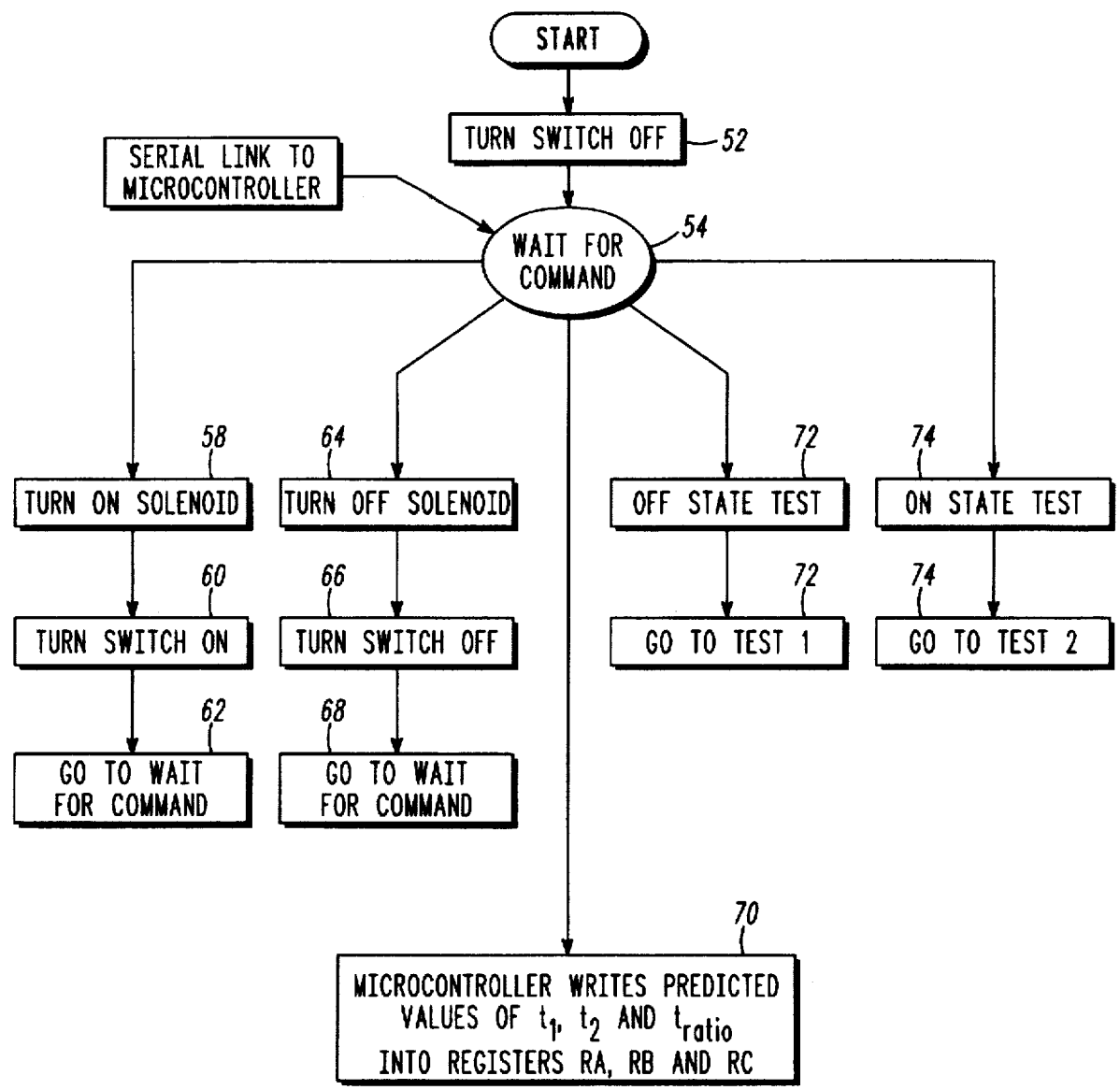
Figure 5B:
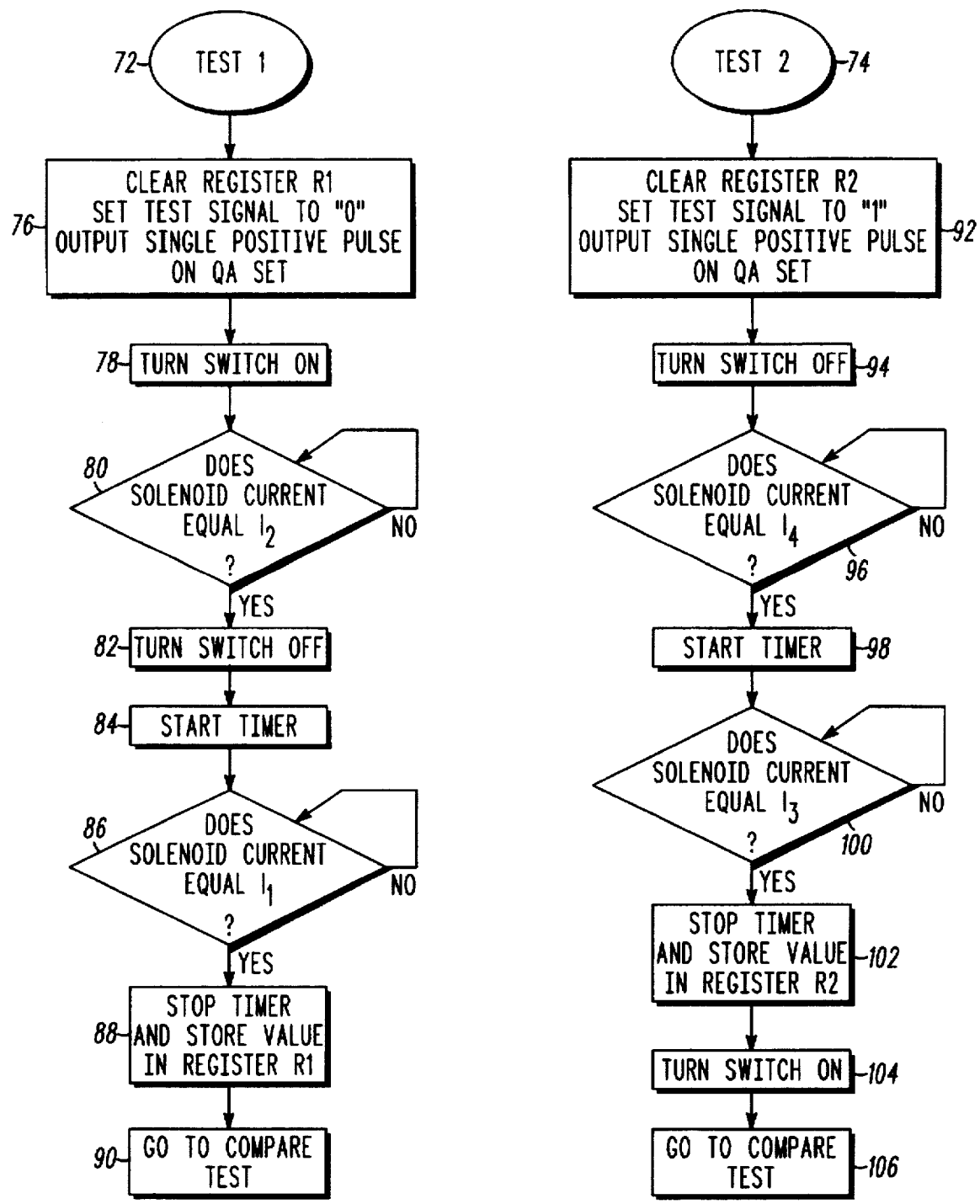

FIGS. 5A, 5B, and 5C illustrate a flowchart of programming logic carried out by controller 36 to determine the operational condition of solenoid 12. FIG. 5A shows the command control sequence for initiating an armature status test. Upon receipt of an appropriate control interrupt, the program shown in FIG. 5A is executed. Following the interrupt, instruction 52 is executed to turn transistor switch 12 off. The program logic then enters a wait condition at step 54 until prompted by a command 56 from the external microcontroller over communication bus 44. The program then either turns solenoid 12 on by executing instruction steps 58, 60 and 62, or maintain solenoid 12 in an off state by executing off instruction steps 64, 66, and 68. Normal operational values for decay times $t_1$, $t_2$, and the ratio of decay times $t_{ratio}$ are written into storage registers Ra, Rb, and Rc in controller 36 by command step 70. Depending upon whether an off-state test or an on-state test is to be performed, the microcontroller initiates either off-state instruction 72 or on-state instruction 74.

Both off-state and on-state programming sequences are shown in FIG. 5B. During the off-state test beginning at step 72, current pulse is sent through the current coil of solenoid 12 at a level below that necessary to pull the armature into the coil. Storage register R1 is cleared at instruction 76 in addition to initializing registers within counter circuit 34. Then, transistor switch 14 is turned on by instruction 78, and instruction 80 is executed if the solenoid current has reached reference level $I_2$. If current level $I_2$ is attained, transistor switch 14 is closed by instruction 82 and a timer is started in counter circuit 34 by instruction 84. Instruction step 86 is executed when the solenoid current has decayed to reference level $I_1$ and the timer is stopped and the value is stored and register R1 by instruction step 88. Program control is then transferred to a comparator within controller 36 by instruction step 90.

The programming sequence for an on-state test from instruction step 74 proceeds in a manner analogous to the off-state test. Register R2 is cleared and control signals are sent to controller 34 by instruction step 92. Then, transistor switch 14 is opened by instruction step 94 and instruction 96 is executed if the solenoid current decays to reference level $I_4$. Counter 34 is initiated by instruction step 98 to begin accumulating time to determine a second decay time. Instruction step 100 is executed if the solenoid current has decayed to current level $I_3$ and counter 34 is stopped and a value is stored in register R2 by instruction step 102. Transistor switch 14 is turned on by instruction step 104 and program control is transferred to a comparator within controller 36 by instruction step 106.

Programming sequencing for comparison of measured decay time values with stored values to determine a fault state within solenoid 12 is described by the flow chart shown in FIG. 5C. Comparison testing is initiated at instruction step 108, where either absolute values are compared or a ratio of decay times is compared with stored values. In a preferred operational method, both an absolute comparison proceeding from instruction 110 and a ratio comparison proceeding from instruction step 112 are performed. The absolute comparison method is initiated by instruction step 114, which generates an on-state fault message at instruction step 116 if the first decay time value stored and register R1 is not equal to the reference decay time value stored and register Ra. If the measured off-state decay time is equal to the reference value, an off-state normal message is generated by instruction step 118. It is important to note that the equality does not have to be exact, and typically the test is carried out using a predetermined range about the value stored in register Ra. For example, if the value in R1 is within the predetermined range about Ra, the values are deemed to be equivalent.

Regardless of whether or not an off-state fault has been detected, instruction step 120 is carried out to determine the presence of an on-state fault. If the second measured decay time value stored in register R2 is not equal to the reference value stored in register Rb, instruction step 122 generates an off-state fault message. If the measured decay time is equal to the reference decay time an on-state normal message is generated by instruction step 124. In either case, programming control returns to the wait condition 54 shown in FIG. 5A. Again, as described above for the R1-Ra comparision, the test here is carried out using a predetermined range about the Rb value.

A ratio test comparison is initiated in instruction step 112. The ratio of the on-state decay time stored and register R2 and the off-state decay time stored and register R1 is calculated. If the ratio of the measured decay times is not equal to (or within a predetermined range) of the stored value, instruction step 128 generates an on-state fault message. If the ratio of decay time values is equal to (or within a predetermined range) the stored value, a normal on-state message is generated by instruction step 130. In either case, programming control returns to the wait condition 54 once the normal or fault state message is generated.

The foregoing programming logic is executed within controller 36, however, instructions 80 and 96 are performed by first comparator 24, and instructions 86 and 100 are performed by second comparator 26.

Figure 6:
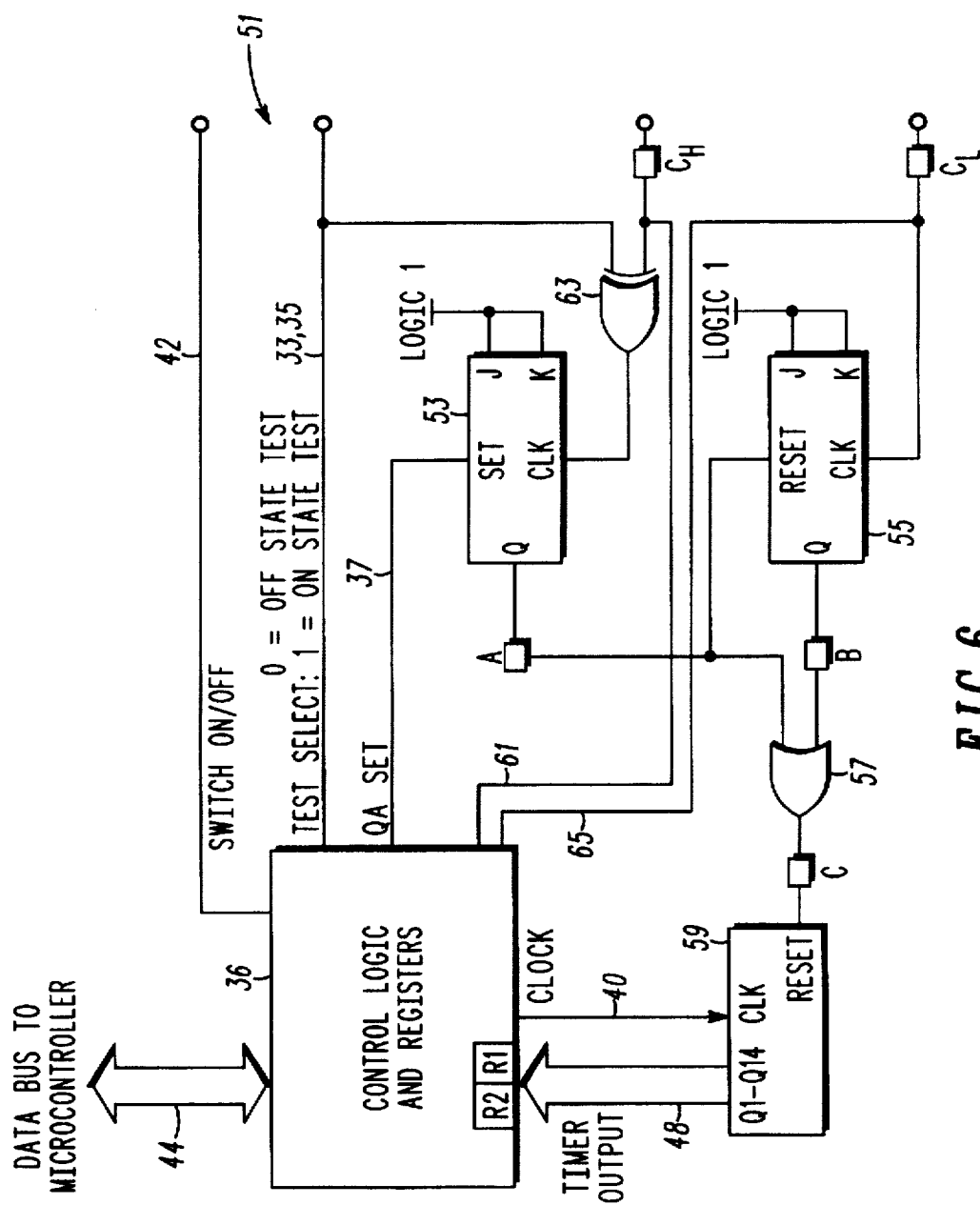
FIG. 6 is a schematic circuit diagram of a counter circuit coupled to a controller and arranged in accordance with the invention.

Those skilled in the art will appreciate that there are many different possible configurations for counter circuit 34. Shown in FIG. 6 is a schematic circuit diagram of a counter circuit 51 suitable for use in solenoid driver 10. Controller 36 is also shown in FIG. 6 to better describe the operation of counter circuit 51. Counter circuit 51 includes first and second JK flip-flops 53 and 55 outputting to an OR gate 57, which is, in turn, coupled to a timer circuit 59. Preferably JK flip-flops 53 and 55 are standard devices, for example MC14027B available from Motorola, Inc., and timer circuit is a standard 14 bit binary device, for example MC14020B also available from Motorola, Inc.

The operation of counter circuit 51 will now be described for an off-state test and measurement of the first decay time t1. In operation, register R1 in controller 36 is cleared and a reference voltage command is transmitted on lines 33,35 to instruct reference circuits 30 and 32 that an off-state test is to be performed. First JK flip-flop is initiated to produce a logic "1" at node A, which in turn forces second JK flip-flop 55 to a logic "0". The logic states at nodes A and B result in a logic "1" output from OR gate 57 and force a reset of outputs Q1–Q14 to logic "0". When the reset input from OR gate 57 is a logic "0", the counter advances and relays a count to controller 36. A power-on (or logic "1" command) is sent over control line 42 to transistor switch 14 (shown in FIG. 1). When the current in solenoid 12 reaches current level $I_2$, first comparator 24 (shown in FIG. 1) outputs a logic "1" at node $C_H$, and upon receiving the logic "1" over line 61, controller 36 outputs a power-off (or logic "0" command) to transistor switch 12. An XOR gate 63 receives the logic "0" state from node $C_H$ and the logic "0" on line 33,35 and outputs a logic "1" to first JK flip-flop 53.

The clock transition input to first JK flip-flop 53 sets the output at node A to a logic "0". When count signal at node C is also a logic "0" and timer circuit 59 is enabled (the output of second JK flip-flop 55 will remain at logic "0" until there is a rising edge on its CLK input).

When the current in solenoid 12 decays to $I_1$, second comparator 26 (shown in FIG. 1) outputs a logic "1" at node CL. The logic "1" at node $C_L$ is routed to controller 36 over line 65 and alerts controller 36 to store output from timer circuit 59 in register R1. The logic state "1" at node CL sets the output of second JK flip-flop 55 to a logic "1" at node B. Since node A is already at logic "0", when a logic "1" is placed on node B a logic "1" is placed on node C, which disables timer circuit 59 and clears outputs Q1–Q14.

Figure 7:
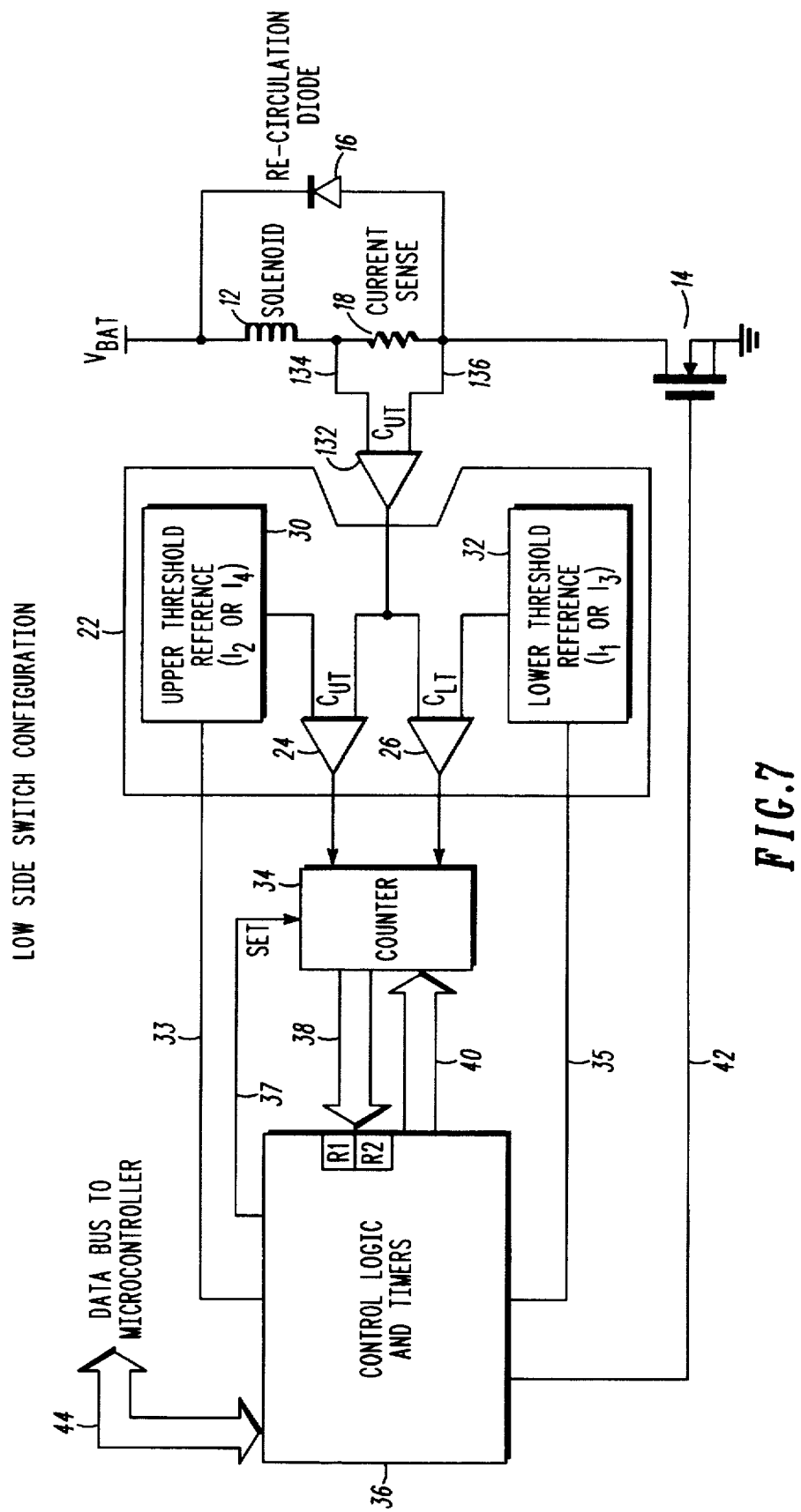
FIG. 7 is a schematic circuit diagram of solenoid driver arranged in accordance with an alternative embodiment of the invention.

An alternative embodiment of the invention is illustrated by the schematic circuit diagram shown in FIG. 7. For clarity, reference numerals for features identical to those described the embodiment shown in FIG. 1 have been repeated. In the alternative embodiment, transistor switch 14 couples current sensor 18 to ground. Solenoid 12 is energized by closing transistor switch 14 and completing a ground connection. Recirculating diode 16 is coupled across current sensor 18 and solenoid 12. A comparator 132 receives voltage signals from first and second inputs 134 and 136. Comparator 132 provides current level information to comparator circuit 32.

Thus it is apparent that there has been provided, in accordance with the invention, a solenoid driver and operational method that fully meet the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications as fall within the scope of the appended claims and equivalents thereof.

We claim:

1. A method for detecting the position of an armature within a solenoid coil comprising the steps of:

providing a first solenoid current, wherein the first solenoid current is insufficient to pull the armature into the solenoid coil;

turning the first solenoid current off and measuring a first current decay time, wherein the step of measuring the first current decay time is independent of a supply voltage;

providing a second solenoid current, wherein the second solenoid current sufficient to pull the armature into the solenoid coil;

turning the second solenoid current off, while maintaining the armature in the solenoid coil, and measuring a second current decay time, wherein the step of measuring the second current decay time is independent of a supply voltage;

providing armature status reference values; and comparing the first and second decay times with the armature status reference values to determine the position of the armature.

2. The method of claim 1, wherein the step of measuring the first current decay time comprises:

determining a start time reference by comparing the first solenoid current with a high reference value;

determining a stop time reference by comparing the first solenoid current with a low reference value;

and calculating the first current decay time by subtracting the stop time reference from the start time reference.

3. The method of claim 1, wherein the step of measuring the second current decay time comprises the steps of:

determining a start time reference by comparing the second solenoid current with a high reference value;

determining a stop time reference by comparing the second solenoid current with a low reference value;

and calculating the second current decay time by subtracting the stop time reference from the start time reference.

4. A solenoid driver capable of detecting the position of an armature within a solenoid coil comprising:

a switching circuit responsive to a control signal and energizing the solenoid coil;

a current sensor coupled to the solenoid coil and outputting a current signal;

a first reference circuit responsive to a first reference command signal and outputting a first reference signal;

a second reference circuit responsive to a second reference command signal and outputting a second reference signal;

a comparator circuit responsive to the current signal and to the first and second reference signals and generating a logic state signal;

a counter circuit responsive to the logic state signal and outputting a time signal; and a controller outputting a power-on signal and a power-off signal to the switching circuit and outputting the first and second reference control signals to the first and second reference circuits, respectively, wherein the controller receives the time signal and calculates a first decay time after terminating the power-on signal and calculates a second decay time after outputting the power-off signal, wherein the first and second decay times are independent of a supply voltage and wherein the controller outputs an armature status signal.

5. The solenoid driver of claim 4, wherein a current developed in the coil during the power-on signal is below that necessary to pull the armature into the coil.

6. The solenoid driver of claim 5, wherein a current maintained in the solenoid coil during the power-off signal is sufficient to maintain the armature in the coil.

7. The solenoid driver of claim 4, wherein the switching circuit couples the solenoid coil to a power source to energize the solenoid coil.

8. The solenoid driver of claim 4, wherein the switching circuit completes a ground connection to energize the solenoid coil.

9. A solenoid driver capable of detecting the position of an armature within a solenoid coil comprising:

a switching circuit responsive to a control signal and energizing the solenoid coil;

a current sensor coupled to the solenoid coil and outputting a current signal;

a first reference circuit responsive to a first reference command signal and outputting a first reference signal;

a second reference circuit responsive to a second reference command signal and outputting a second reference signal;

a comparator circuit responsive to the current signal and to the first and second reference signals and generating a logic state signal, wherein the comparator circuit includes, a first comparator coupled to the first reference circuit; and a second comparator coupled to the second reference circuit, wherein the first and second comparators are connected to the current sensor by a common node, and wherein the first comparator outputs a first logic state signal responsive to the magnitude of the current signal and the first reference signal, and wherein the second comparator outputs a second logic state signal responsive to the magnitude of the current signal and second reference signal;

a counter circuit responsive to the logic state signal and outputting a time signal; and a controller outputting a power-on signal and a power-off signal to the switching circuit and outputting the first and second reference control signals to the first and second reference circuits, respectively, wherein the controller receives the time signal and calculates a first decay time after terminating the power-on signal and calculates a second decay time after outputting the power-off signal, and wherein the controller outputs an armature status signal.

10. The solenoid driver of claim 9, wherein the counter circuit comprises:

a first JK flip-flop receiving an one input from the controller and another input from an XOR gate and outputting to an OR gate;

a second JK flip-flop receiving an one input from the controller and another input from an the second comparator and outputting to the OR gate; and a clock circuit receiving an input from the OR gate and outputting timing values to the controller.

11. The solenoid driver of claim 9, wherein the controller determines the armature position by comparing the first decay time with a first reference time standard correlated to current values less than that necessary to pull the armature into the solenoid coil and by comparing the second decay time with a second reference time standard correlated to current values greater than that necessary to maintain the armature within the solenoid coil.

12. A solenoid driver capable of detecting the position of an armature within a solenoid coil comprising:

a switch coupled to the solenoid coil, such that the solenoid coil is energizing when the switch is turned on;

a current sensor coupled to the solenoid coil and outputting a current signal;

a comparator circuit coupled to the current sensor and configured to receive reference signals from first and second reference circuits, wherein the comparator circuit generates an output signal to a counter circuit in response to the relative magnitude of the current signal and the reference signal from the first and second reference circuits; and a controller outputting a power-on signal and a power-off signal to the switch, wherein the controller receives a time signal from the counter circuit and measures a first decay time after outputting the power-on signal, and measures a second decay time during output of the power-off signal, wherein the first and second decay times are independent of a supply voltage, and wherein the controller compares the first and second decay times to reference time standards and outputs an armature status signal.

13. The solenoid driver of claim 12, wherein a current developed in the solenoid coil during the power-on signal is below that necessary to pull the armature into the solenoid coil, and wherein a current maintained in the coil during the power-off signal is sufficient to maintain the armature in the coil.

14. The solenoid driver of claim 12, wherein the switch couples the coil to a power source to energize the solenoid coil.

15. The solenoid driver of claim 12, wherein the switch completes a ground connection to energize the solenoid coil.

16. A solenoid driver capable of detecting the position of an armature within a solenoid coil comprising:

a transistor switch coupled to a power source and supplying on and off current to the solenoid coil;

a first reference circuit and a second reference circuit;

a current sensor coupled to the solenoid coil;

a first comparator having a first input coupled to the current sensor and a second input coupled to the first reference circuit, the first comparator outputting a first logic state signal;

a second comparator having a first input coupled to the current sensor and a second input coupled to the second reference circuit, the second comparator outputting a second logic state signal;

a first counter circuit responsive to the first and second logic state signals and outputting first and second timing signals; and a controller having a first output coupled to the transistor switch, a second output coupled to the first reference circuit, a third output coupled to the second reference circuit, wherein the controller outputs a power-on signal to the transistor switch and receives the first and second timing signals when the armature is outside of the solenoid coil, and wherein the controller outputs a power-off signal to the transistor switch and receives the first and second timing signals when the armature is within the solenoid coil, and wherein the controller measures a first decay time after outputting the power-on signal and measures a second decay time when outputting the power-off signal and outputs an armature position signal, and wherein the first and second decay times are independent of a supply voltage.

17. A solenoid driver capable of detecting the position of an armature within a solenoid coil comprising:

means for generating current pulses in the solenoid coil;

means for measuring a decay time of a first current pulse and a second current pulse, wherein the first and second decay times are independent of a supply voltage, and wherein the first current pulse is insufficient to pull the armature into the solenoid coil, and wherein the second current pulse is sufficient to maintain the armature within the solenoid coil; and means for comparing the first and second decay times with time reference standards to determine the armature position.

18. A solenoid driver capable of detecting the position of an armature within a solenoid coil comprising:

means for generating current pulses in the solenoid coil;

means for measuring a decay time of a first current pulse and a second current pulse, wherein the first current pulse is insufficient to pull the armature into the solenoid coil, and wherein the second current pulse is sufficient to maintain the armature within the solenoid coil; and means for comparing the first and second decay times with time reference standards to determine the armature position, and wherein the means for measuring includes, a comparator circuit including a first comparator coupled to a first reference circuit and a second comparator coupled to a second reference circuit, wherein the first and second comparators are connected to a current sensor by a common node, and wherein the first comparator outputs a first logic state in response to the magnitude of a current signal from the current sensor and a first reference signal from the first reference circuit, and wherein the second comparator outputs a second logic state in response to the magnitude of a current signal from the current sensor and a second reference signal from the second reference circuit.

19. The solenoid driver of claim 18, wherein means for measuring further comprises:

a counter circuit including a first counter configured to receive the first logic state from the first comparator and a first clock signal from a controller, and a second counter configured to receive the second logic state signal from the second comparator and a second clock signal from the controller, wherein the first counter outputs a first time signal to the controller when the current signal is less than the first reference signal, and wherein the second counter outputs a second time signal to the controller when the current signal is greater than the second reference signal.

20. A solenoid driver capable of detecting the position of an armature within a solenoid coil comprising:

a controller circuit generating first and second current pulses to the solenoid coil, wherein the first current pulse is insufficient to pull the armature into the solenoid coil, and wherein the second current pulse is sufficient to maintain the armature within the solenoid coil;

a timing circuit measuring a first decay time of the first current pulse and a second decay time of the second current pulse, wherein the first and second decay times are independent of a supply voltage; and a logic circuit receiving the first and second decay times and comparing the first and second decay times to reference decay times standards, and outputting an armature status message.

21. The solenoid driver of claim 20, wherein the controller circuit comprises a switch coupling the solenoid coil to a power source to energize the solenoid coil.

22. The solenoid driver of claim 20, wherein the controller circuit comprises a switch that completes a ground connection to energize the solenoid coil.

* * * * *